United States Patent
Alcorn et al.

(10) Patent No.: US 10,198,320 B2
(45) Date of Patent: Feb. 5, 2019

(54) POWER-LOSS PROTECTION

(71) Applicant: Hewlett-Packard Development Company, L.P., Houston, TX (US)

(72) Inventors: Byron A. Alcorn, Fort Collins, CO (US); Scott W. Briggs, Cypress, TX (US); Joel Pierre Lefebvre, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/520,248

(22) PCT Filed: Oct. 31, 2014

(86) PCT No.: PCT/US2014/063323
§ 371 (c)(1),
(2) Date: Apr. 19, 2017

(87) PCT Pub. No.: WO2016/068978
PCT Pub. Date: May 6, 2016

(65) Prior Publication Data
US 2017/0315873 A1　Nov. 2, 2017

(51) Int. Cl.
*G11C 5/14* (2006.01)
*G06F 11/14* (2006.01)
*G06F 13/16* (2006.01)

(52) U.S. Cl.
CPC ...... *G06F 11/1441* (2013.01); *G06F 13/1694* (2013.01); *G11C 5/141* (2013.01); *G11C 5/143* (2013.01)

(58) Field of Classification Search
CPC . G06F 11/1441; G06F 13/1694; G11C 5/141; G11C 5/143
USPC ................................................ 365/226, 228
See application file for complete search history.

(56) References Cited

U.S. PATENT DOCUMENTS

| 5,227,943 | A | 7/1993 | Cargille |
| 8,230,257 | B2 | 7/2012 | Wilson et al. |
| 9,558,565 | B2 * | 1/2017 | Biring ........................ G06T 7/12 |
| 2003/0126494 | A1 | 7/2003 | Strasser |
| 2006/0015683 | A1 | 1/2006 | Ashmore et al. |
| 2008/0162814 | A1 | 7/2008 | Kim |
| 2009/0249087 | A1 | 10/2009 | Wakrat et al. |

(Continued)

FOREIGN PATENT DOCUMENTS

| CN | 102436419 | 5/2012 |
| EP | 0964360 | 12/1999 |

(Continued)

OTHER PUBLICATIONS

Boyd, James. "Device Sleep Technical Proposal," AHCI 1.3.1, AHCI 1_3_1 TP001v8_11112011.doc (90 pages).

(Continued)

*Primary Examiner* — Viet Q Nguyen
(74) *Attorney, Agent, or Firm* — Fabian VanCott

(57) ABSTRACT

Power loss in a client device is detected. In response to the detecting of the power loss, an electronic card is alerted that the power loss is about to occur, where the electronic card includes a volatile storage and a non-volatile storage. A transfer of data from the volatile storage to the non-volatile storage is triggered in response to the alert.

20 Claims, 5 Drawing Sheets

(56) References Cited

U.S. PATENT DOCUMENTS

| | | | |
|---|---|---|---|
| 2010/0235594 A1* | 9/2010 | Heller | G06F 12/0246 711/162 |
| 2010/0332858 A1* | 12/2010 | Trantham | G06F 1/263 713/300 |
| 2010/0332859 A1* | 12/2010 | Trantham | G06F 1/26 713/300 |
| 2010/0332862 A1* | 12/2010 | Lester | G06F 1/30 713/300 |
| 2011/0066872 A1* | 3/2011 | Miller | G06F 1/30 713/340 |
| 2011/0093650 A1 | 4/2011 | Kwon et al. | |
| 2011/0153903 A1* | 6/2011 | Hinkle | G06F 13/20 710/313 |
| 2012/0079171 A1 | 3/2012 | Ju et al. | |
| 2012/0324274 A1* | 12/2012 | Hori | G06F 1/30 714/6.1 |
| 2013/0039141 A1 | 2/2013 | Smith et al. | |
| 2013/0076530 A1 | 3/2013 | Heckel, III | |
| 2013/0191578 A1* | 7/2013 | Goss | G06F 12/0804 711/102 |
| 2013/0205065 A1* | 8/2013 | Kloeppner | G06F 12/0868 711/103 |
| 2014/0215277 A1* | 7/2014 | Judd | G06F 11/2284 714/42 |
| 2014/0219021 A1* | 8/2014 | Trantham | G11C 5/143 365/185.04 |
| 2014/0258755 A1* | 9/2014 | Stenfort | G06F 1/30 713/323 |
| 2015/0029808 A1* | 1/2015 | Allison | G11C 5/005 365/227 |
| 2015/0046747 A1* | 2/2015 | Gaertner | G06F 11/1666 714/6.11 |
| 2015/0052397 A1* | 2/2015 | Nakamura | G06F 11/1415 714/22 |
| 2015/0089287 A1* | 3/2015 | Jayakumar | G06F 1/30 714/23 |
| 2015/0170716 A1* | 6/2015 | Lucas | G11C 5/147 365/226 |
| 2015/0355686 A1* | 12/2015 | Heyd | G06F 1/187 361/679.31 |
| 2015/0378415 A1* | 12/2015 | George | G06F 1/30 307/64 |
| 2016/0011927 A1* | 1/2016 | Sweere | G06F 1/263 714/57 |
| 2016/0065000 A1* | 3/2016 | Maeda | H02J 9/061 307/23 |
| 2016/0071609 A1* | 3/2016 | Lucas | G11C 16/30 365/185.18 |
| 2016/0139982 A1* | 5/2016 | Yu | G11C 14/0018 714/768 |
| 2016/0231939 A1* | 8/2016 | Cannata | G06F 3/0604 |
| 2016/0259754 A1* | 9/2016 | Ping | G06F 3/0688 |
| 2016/0268000 A1* | 9/2016 | Thompson | G11C 16/30 |
| 2016/0335220 A1* | 11/2016 | Breakstone | G06F 13/4068 |
| 2017/0091042 A1* | 3/2017 | Chou | G06F 11/1415 |

FOREIGN PATENT DOCUMENTS

| | | |
|---|---|---|
| TW | 200425607 | 11/2004 |
| TW | 201106371 | 2/2011 |
| WO | WO-2014047049 | 3/2014 |

OTHER PUBLICATIONS

PCI-SIG, "P.C.I. Express Card Electromechanical Specification Revision 1.1," Mar. 28, 2005 (90 pages).

Using Innodisk's iCell Technology to Prevent Data Loss in SSDs: Triggering DRAM Buffer to Flash Data Transfer During Sudden Power Outage, an InnoDisk White Paper, Jul. 2012, pp. 1-5, Available at: <texim-europe.com/getfile.aspx?id=96994>.

* cited by examiner

POWER-LOSS PROTECTION

BACKGROUND

A system, such as a computer or other type of electronic system, can include a storage device to store data. In some cases, a storage device can include both volatile storage and non-volatile storage. Volatile storage refers to storage that loses data stored in the volatile storage if power is removed from the volatile storage. A non-volatile storage, on the other hand, maintains data stored in the non-volatile storage even if power is removed from the non-volatile storage.

BRIEF DESCRIPTION OF THE DRAWINGS

Some implementations are described with respect to the following figures.

DETAILED DESCRIPTION

An electronic card can be connected to a client device, such as to an external port of the client device or to an internal connection point (e.g. a socket, a circuit board attachment, etc.) in the client device. A "client device" can refer to any system or electronic device that is available for single-user use at a given time. In other words, at any given time, one user is able to use the client device using user-input components of the client device to interact with the client device. Examples of user-input components can include one or any combination of the following: an input mouse device, an input pointer device, a keyboard, a touchpad, a touchscreen, and so forth. A client device differs from a server device that is concurrently accessible over a network by multiple users.

An electronic card can include a support substrate on which is mounted various electronic components. The support substrate can be a circuit board or other type of support substrate, and can include communication channels (e.g. electrically conductive traces, optical paths, etc.) for connecting to input/output (I/O) elements (e.g. electrical pins, optical ferrules, etc.) of various components on the support substrate.

An electronic card can include volatile storage and non-volatile storage. A "storage" can refer to one or multiple storage devices, or alternatively, a "storage" can refer to a portion of a storage device (or a portion of multiple storage devices). A volatile storage loses data stored in the volatile storage when power is removed from the volatile storage. On the other hand, a non-volatile storage can maintain data stored in the non-volatile storage even if power is removed from the non-volatile storage.

When an electronic card that includes a volatile storage and a non-volatile storage is used with a client device, power can be provided to the electronic card by the client device. When power loss occurs in the client device, then data in the volatile storage of the electronic card can be lost when the client device is no longer able to supply power to the electronic card. Power loss of the client device can occur due to various reasons, such as a battery of the client device being depleted, the client device being unplugged from a power outlet, a fault or error occurring, or for any other reason.

In accordance with some implementations, a power-loss detection circuit and a temporary power source can be provided to protect an electronic card from data loss due to loss of power at a client device to which the electronic card is operatively coupled. The electronic card is operatively coupled to a client device if the electronic card is in communication with the client device and power is being supplied to the electronic card by the client device. As an example, the electronic card can be plugged into an external port of the client device, or can be connected to an internal connection point in the client device.

Figure 1A:
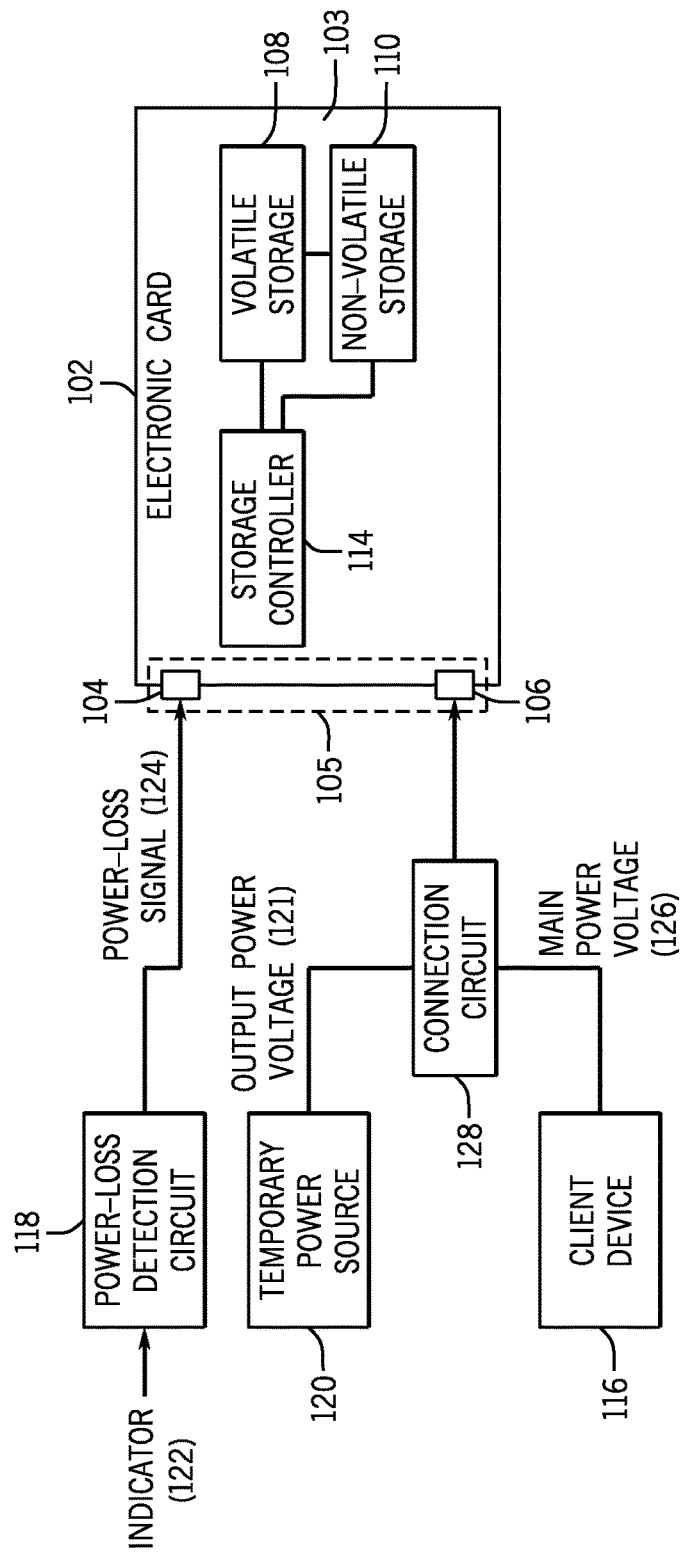
FIG. 1A is a block diagram of an example arrangement that includes a power-loss detection circuit, a temporary power source, and an electronic card being protected by the power-loss detection circuit and the temporary power source, in accordance with some implementations.

FIG. 1A is a schematic diagram of an example arrangement that includes an electronic card 102 that has a control input 104 and a power input 106. Note that the electronic card can include various other inputs (as well as outputs) that are not shown. The various inputs and outputs can be in the form of I/O electrical pins, optical ferrules, or other I/O elements used for establishing communication with components external of the electronic card 102. The I/O elements can be part of a connector 105 (or multiple connectors) of the electronic card 102. The connector 105 can be connected to a mating connector (such as a mating connector in a port of the client device), or alternatively, the connector 105 can be connected to a cable (e.g. electrical cable, optical cable, etc.).

The electronic card 102 includes a volatile storage 108 and a non-volatile storage 110. In addition, the electronic card 102 includes a storage controller 114 that is able to control the volatile storage 108 and the non-volatile storage 110. In other examples, multiple storage controllers, one for each of the volatile storage 108 and non-volatile storage 110, can be provided.

In some examples, the electronic card 102 is a storage card whose primary functionality is to store data, such as when the electronic card 102 is operatively coupled to the client device 116. An example of a storage card includes a solid state storage (SSD) card, which can include one or multiple flash memory devices or other types of non-volatile storage devices.

In other examples, the electronic card 102 can be a different type of electronic card. For example, the electronic card 102 can be in a network interface card, a graphics processing card, a processor card, and so forth. In such cases, the electronic card 102 can include other components (not shown) to perform other functionalities of the electronic card 102.

Various components of the electronic card 102 can be mounted on a support substrate 103 of the electronic card 102. The support substrate 103 can be a circuit board or any other type of support substrate. In some examples, the components of the electronic card 102 can be mounted on one support surface of the support substrate 103. In other examples, components of the electronic card 102 can be mounted on multiple support surfaces of the support substrate 103.

FIG. 1A also shows a power-loss detection circuit 118 and a temporary power source 120. The power-loss detection circuit 118 receives an indicator 122, which can be an indicator from the client device 116 that that power loss may occur. In some examples, as discussed further below in connection with FIG. 4A, the indicator 122 can be a power-good signal being deactivated by the client device 116 (discussed further below). In other examples, as discussed further below in connection with FIG. 4B, the indicator 122 can be the main power voltage of the client device 116 dropping below a threshold voltage (discussed further below). In response to the indicator 122, the power-loss detection circuit 118 can activate a power-loss signal 124 to the control input 104 of the electronic card 102. The power-loss signal 124 indicates to the electronic card 102 that power loss is about to occur at the client device 116.

The temporary power source 120 can be any type of power source that can temporarily supply power (in the form of an output power voltage 121) to the electronic card 102 when a main power voltage 126 from the client device 116 is not available. The main power voltage 126 can be provided by a power supply (not shown) of the client device 116.

As examples, the temporary power source 120 can include an arrangement of one or multiple capacitors that can be charged. When the arrangement of capacitor(s) is selectively connected to the electronic card 102 by a connection circuit 128 (such as due to loss of the main power voltage 126), power from the charged capacitor(s) can be supplied through the power input 106 to power various components of the electronic card 102, such as the storage controller 114, volatile storage 108, and non-volatile storage 110. If the electronic card 102 includes other components, these other components may or may not receive power from the temporary power source 120.

During normal operation of the client device 116 when the main power voltage 126 is available from the client device 116 (i.e. the main power voltage 126 is at a level that is within a specified active range), the connection circuit 128 selectively connects the main power voltage 126 to the power input 106, and the temporary power source 120 is isolated from the power input 106. In some implementations, the main power voltage 126 can charge the temporary power source 120 through the connection circuit 128.

In other examples, the temporary power source 120 can include one or multiple batteries instead of or in addition to an arrangement of capacitor(s).

The connection circuit 128 used to selectively connect one of the temporary power source 120 and the main power voltage 126 to the power input of the electronic card 102 can have a relatively simple design. For example, the connection circuit 128 can be implemented with passive switches such as diodes. Alternatively, the connection circuit 128 can be implemented with active switches such as transistors. In accordance with some implementations, to reduce complexity, the connection circuit 128 is not implemented with a switching matrix that is able to selectively connect any one of multiple inputs to any one of multiple outputs.

In response to the power-loss signal 124 received at the control input 104, the electronic card 102 can perform a data protection process, which can include copying or moving data in the volatile storage 108 to the non-volatile storage 110. The data protection process can be performed while the electronic card is powered by the temporary power source 120 (due to the main power voltage 126 not being available).

In some examples, the moving of data in the volatile storage 108 to the non-volatile storage 110 can refer to flushing the data from the volatile storage 108 to the non-volatile storage 110. The data protection process is considered to "harden" the data in the electronic device 102, since the data is moved to a location that allows the data to be maintained when power is removed from the electronic card 102 (such as due to the temporary power source 120 becoming depleted after some time has passed).

Figure 1B:
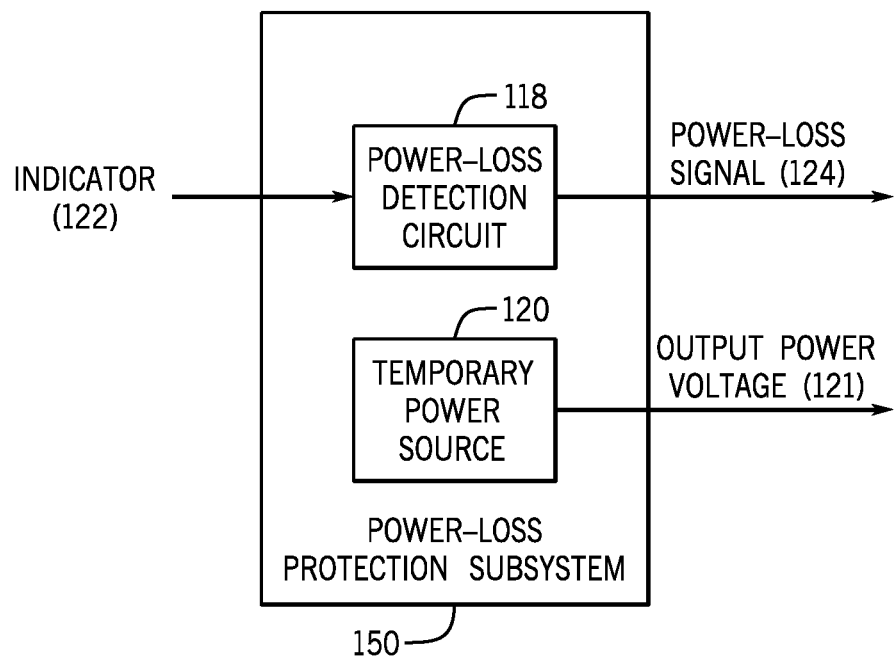
FIG. 1B is a block diagram of an example power-loss protection subsystem, according to some implementations.

In some implementations, as shown in FIG. 1B, the power-loss detection circuit 118 and the temporary power source 120 can be considered to be part of a power-loss protection subsystem or apparatus 150. Moreover, in some implementations, the connection circuit 128 can also be considered to be part of the power-loss protection subsystem 150. In some examples, the power-loss protection subsystem 150 can be included in the client device 116. In other examples, the power-loss protection subsystem 150 can be separate from the client device 116, and can be provided on a circuit board that is connectable to the electronic card 102. Alternatively, the power-loss protection subsystem 150 and the electronic card 102 can be mounted on a common circuit board.

In each of the foregoing examples, the power-loss protection subsystem 150 is separate from the electronic card 102. The power-loss protection subsystem 150 can thus be considered to be an off-device or off-card power-loss protection subsystem for the electronic card 102.

In some implementations, the electronic card 102 can be an M.2 card that conforms to the M.2 standard, formerly referred to as the Next Generation Form Factor (NGFF) standard. The M.2 standard (provided by the Peripheral Component Interconnect Special Interest Group or PCI-SIG) defines a form factor for an electronic card. A form factor of an electronic card can refer to the dimensions of the electronic card and other properties, such as locations of mounting structures (e.g. mounting holes, mounting notches, mounting pins, etc.), and other properties. In addition, the M.2 standard also defines the connector 105 to be used on an electronic card, including the position of the connector, the number of pins on the connector, and the actual signal and power pins used on the connector 105.

According to the M.2 standard, a communication medium that is connectable to the connector 105 of the M.2 electronic card 102 (such as a communication medium between the client device 116 and the M.2 electronic card 102) operates according to a Peripheral Component Interconnect Express (PCIe) standard. Thus, the communication medium between the electronic card 102 and the client device 116 can be a PCIe bus. PCIe defines a high-speed serial computer expansion bus standard. In such examples, the connector 105 of the M.2 electronic card 102 is a PCIe connector.

In examples where the communication medium between the electronic card 102 and the client device 116 is a PCIe bus, the control input 104 to the electronic card 102 that receives the power-loss signal 124 can be a PERST# input according to the PCIe standard. The PERST# input is a link interface reset input of the electronic card 102. When activated, the PERST# input when activated indicates that a power supply voltage is at an operational level (in other words, the power supply voltage is within a specified voltage tolerance and is stable). The PERST# input when activated also causes initialization of logic in the electronic card 102 once the power supply voltage stabilizes. As long as the PERST# input is active (asserted to a low state, for example), link interface functionality of the electronic card 102 relating to a PCIe bus are held in reset. In response to the PERST# input being deactivated (or deasserted to a high voltage, for example), the link interface functions of the electronic card 102 can be started and activated. A link interface function can refer to a function of the electronic card 102 relating to communicating over a communication medium, such as a PCIe bus.

In other examples, the electronic card 102 can be a different type of electronic card (different from an M.2 electronic card), and a communication medium between the electronic card 102 and the client device 116 can be a different type of communication medium.

In further examples, the electronic card 102 can be a Serial Advanced Technology Attachment (SATA) card that can operate according to the SATA protocol. In such examples, the control input 104 can be a control input according to the SATA protocol. For example, the control input 104 can be an input that is used to place the electronic card 102 into a lower power state. According to SATA, such a control input can be referred to as a DEVSLP input, which when activated indicates to the electronic card 102 that the electronic card 102 is to enter into a low power state. A low power state can refer to a power state in which various components (or all components) of the electronic card 102 are placed into a power off state.

Figure 2:
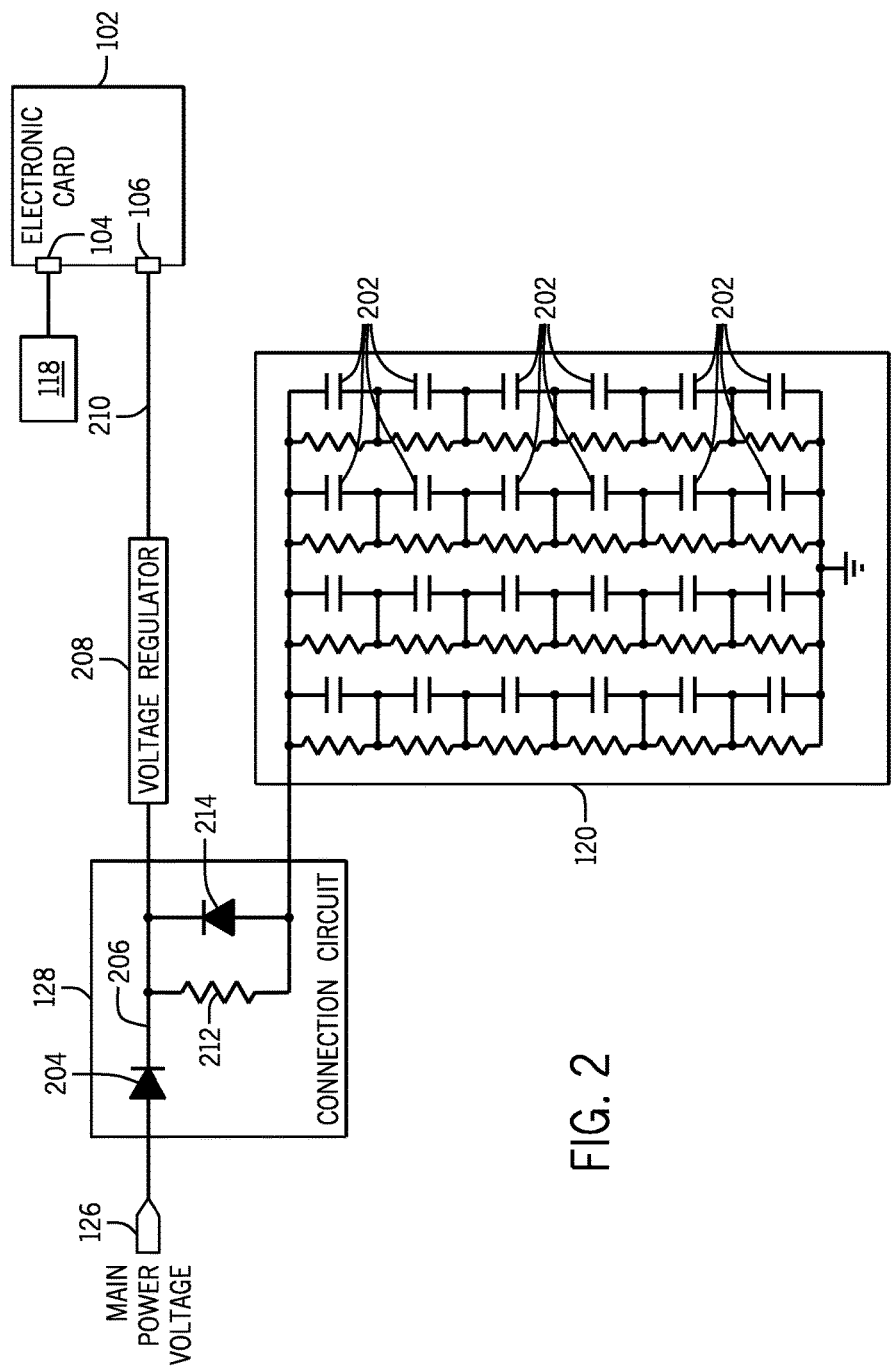
FIGS. 2 and 3 are schematic diagrams of example arrangements according to various implementations.

FIG. 2 is a schematic diagram of an example arrangement according to some implementations. In the example of FIG. 2, the temporary power source 120 includes an arrangement of capacitors 202 that can be charged to a particular voltage, where the charge of the capacitors 202 can be used for temporarily powering the electronic card 102 when the main power voltage 126 is not available. In the example of FIG. 2, the main power voltage 126 is supplied through a diode 204 to a node 206 that is connected to an input of a voltage regulator 208. The diode 204 can be part of the connection circuit 128.

The voltage regulator 208 receives the main power voltage 126 (when available) through the diode 204, and produces an output voltage at the output of the voltage regulator 208 at a specified regulated voltage. Note that the output of the diode 204 is a voltage that is equal to the main power voltage 126 less a threshold voltage of the diode 204. The voltage at the input of the voltage regulator 208 can be different from the voltage at the output of the voltage regulator 208.

The regulated voltage output by the voltage regulator 208 can be provided as an input power voltage 210 supplied to the power input 106 of the electronic card 102. In some examples, the main power voltage 126 can be at about 12 volts, while the input power voltage 210 output by the voltage regulator 208 can be at about 3.3 volts. In other examples, the main power supply voltage 126 and the input power voltage 210 can be at different voltages.

The connection circuit 128 also includes a resistor 212 and a diode 214 connected in parallel between the output power voltage of the temporary power source 120 and the node 206 that is connected to the input of the voltage regulator 208. When the main power voltage 126 is available, the diode 214 is off (while the diode 204 is on) to allow current to flow from a main power supply (of the client device 116) to the voltage regulator 208. In addition, the power from the main power supply can also charge the capacitors 202 through the resistor 212.

When the main power voltage 126 is no longer available (off), the diode 204 shuts off, and the power voltage from the temporary power source 120 flows through the diode 214 (which is on) to the input of the voltage regulator 208, which outputs the regulated output voltage in response to the power voltage from the temporary power source 120.

Figure 3:
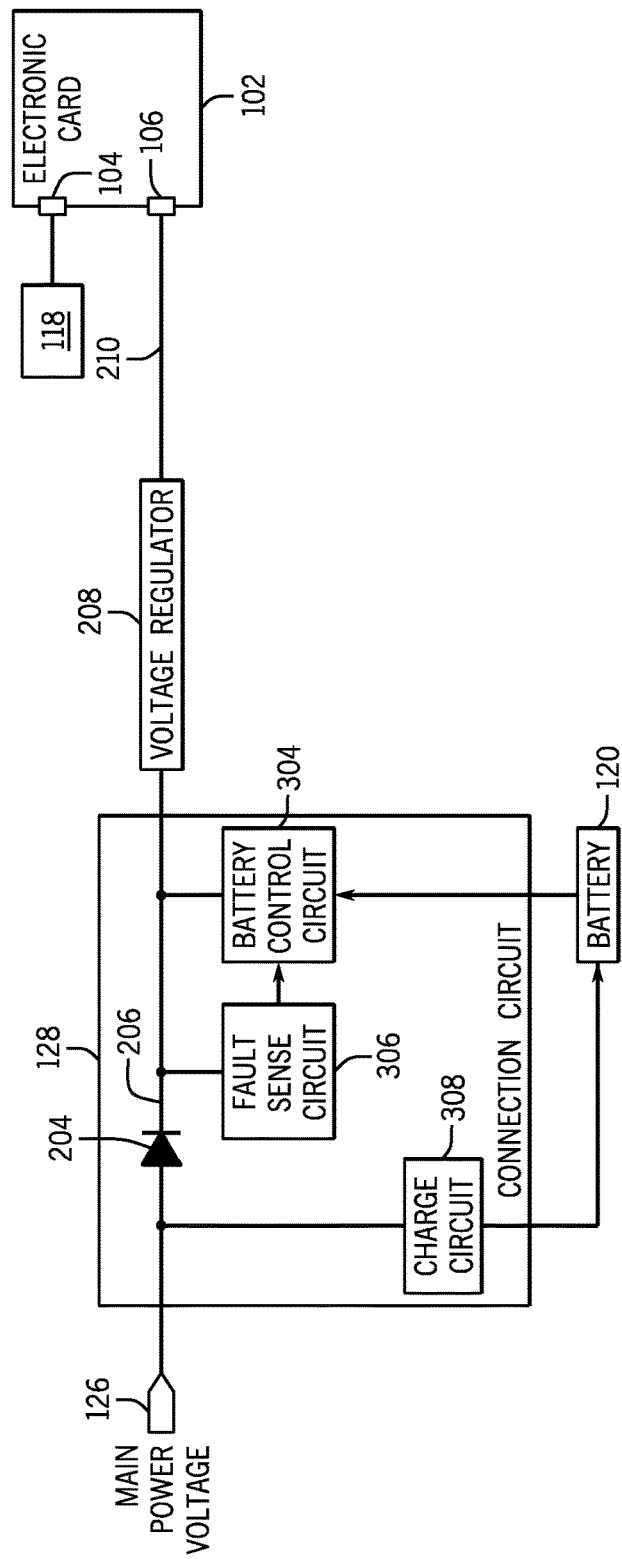

FIG. 3 is a schematic diagram of an example arrangement according to alternative implementations. In FIG. 3, the temporary power source 120 includes a battery. The connection circuit 128 to selectively connect the main power voltage 126 and the power voltage of the battery 120 to the node 206 (connected to the input of the voltage regulator 208) can include a battery control circuit 304, which is able to control whether the power voltage of the battery 120 is supplied to the node 206.

The connection circuit 128 can also include a fault-sense circuit 306, which is used to determine whether a fault at the main power voltage 126. In addition, the connection circuit 128 can include a charge circuit 308 to allow the main power supply to charge the battery 120.

The main power voltage 126 when available is passed through the diode 204 to the input of the voltage regulator 208. In this scenario, the fault-sense circuit 306 detects that there is power from the main power supply, and thus, the fault-sense circuit 306 does not assert a fault-sense indication to the battery control circuit 304. When the fault-sense indication is not present, the battery control circuit 304 isolates the battery 120 from the node 206 that is connected to the input of the voltage regulator 208.

However, if the main power voltage 126 is no longer available, the fault-sense circuit 306 activates a fault-sense indication to the battery control circuit 304, which causes the battery control circuit 304 to couple the power voltage of the battery 120 to the node 206 that is connected to the input of the voltage regulator 208. In this case, the diode 204 is turned off. The voltage regulator 208 can output its regulated voltage in response to the power voltage from the battery 120, for powering the electronic card 102.

In a variant of the FIG. 3 implementations, instead of using the power-loss detection circuit 118 to provide the power-loss signal 124 to the control input 104 of the electronic card 102, the fault-sense circuit 306 can instead be used to provide the power-loss signal 124 to the control input 104 of the electronic card 102.

In another variant of the FIG. 3 implementations, instead of using the fault-sense circuit 306, the power-loss detection circuit 118 can be used to supply the fault-sense indication to the battery control circuit 304.

Figure 4A:
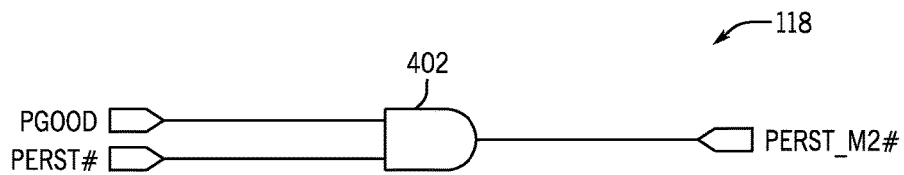
FIGS. 4A and 4B are schematic diagrams of example power-loss detection circuits, according to various implementations.

FIG. 4A illustrates an example power-loss detection circuit 118 according to some implementations. The output of the power-loss detection circuit 118 is a PERST_M2# signal, which can be connected to the control input 104 of the electronic card 102. The PERST_M2# signal (an example of the power-loss signal 124 of FIG. 1A or 1B) is produced by the output of an AND gate 402, which receives two inputs: a PERST# signal (or more generally a link interface reset signal) from the client device 116, and a PGood signal (or more generally a power-good signal) from the client device 116. The PERST# signal can be a signal according to the PCIe protocol.

The PGood signal when deactivated low indicates that power is not available at the client device 116, either due to a normal shutdown procedure or due to a fault or other error. The PGood signal when deactivated low is an example of the indicator 122 of FIG. 1A or 1B. The PGood signal when activated high indicates that power is available at the client device 116. When the PGood signal is deactivated low, the AND gate activates the PERST_M2# signal to a low state.

The PERST_M2# signal is an active low signal. This signal is activated when either PERST# from the client device 116 is active low, or PGood is deactivated low.

Although specific example input signals to the AND gate 402 are depicted in FIG. 4, it is noted that in other examples, other types of input signals can be provided to the AND gate 402. Moreover, in other examples, the power-loss detection circuit 118 can include other logic.

Figure 4B:
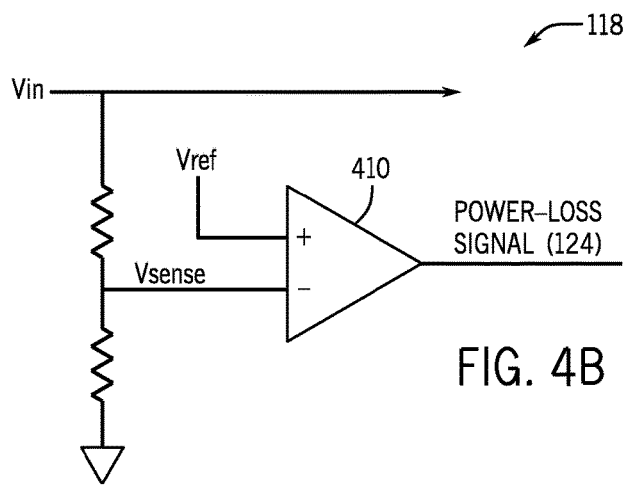

FIG. 4B is a schematic diagram of an example power-loss detection circuit 118 according to alternative implementations. The power-loss detection circuit 118 of FIG. 4B includes a comparator 410 that compares a voltage Vsense to a reference voltage Vref (a specified threshold voltage). The voltage Vsense is provided by a voltage divider including resistors 412 and 414 connected between Vin (which is the main power voltage 126 from the client device 116) and ground.

If Vsense is greater than Vref, then the comparator 410 maintains the power-loss signal 124 deactivated. However, if Vsense is lower than Vref, then the comparator 410 activates the power-loss signal 124.

Figure 5:
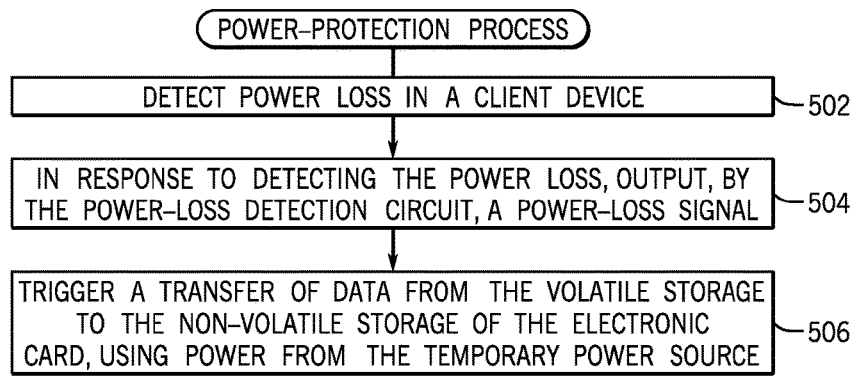
FIG. 5 is a flow diagram of an example power-loss protection process, according to some implementations.

FIG. 5 is a flow diagram of a power-protection process according to some implementations. The power-protection process of FIG. 5 detects (at 502) power loss in the client device 116. The detecting can be performed by the power-loss detection circuit 118.

In response to the detecting of the power loss, the power-loss detection circuit 118 outputs (at 504) a signal to the control input 104 of the electronic card 102 for indicating to the electronic card that the power loss is about to occur. The signal outputted to the control input 104 of the electronic card 102 is an example of how the power-loss detection circuit 118 can alert the electronic card 102 that power loss is about to occur.

The power-protection process further includes triggering (at 506) a transfer of data from the volatile storage 108 to the non-volatile storage 110, in response to the power-loss signal 124. The transfer of data from the volatile storage 108 to the non-volatile storage 110 can be performed while the electronic card 102 is powered by the temporary power source 120.

By using the power-loss protection subsystem according to some implementations, which is separate from the electronic card being protected, user experience can be enhanced since data loss is prevented or made less likely due to power loss at a client device. By using the separate power-loss protection subsystem according to some implementations, the electronic card would not have included power-loss protection components, which can make the electronic card more complex or costly.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A power-loss protection apparatus comprising:
a power source; and
a power-loss detection circuit to detect an indication of power loss in a client device, and to alert an M.2 electronic card for indicating the power loss is about to occur,
the power-loss protection apparatus being separate from the M.2 electronic card that includes a volatile storage and a non-volatile storage, and wherein the alert is to trigger a transfer of data from the volatile storage to the non-volatile storage using power from the power source; and
wherein the power-loss detection circuit is to alert the M.2 electronic card by outputting a signal to a link interface reset input of the M.2 electronic card.

2. The power-loss protection apparatus of claim 1, wherein the client device includes an electronic device available for single-user use at a given time.

3. The power-loss protection apparatus of claim 1, wherein the link interface reset input of the M.2 electronic card includes a PERST# input according to a Peripheral Component Interconnect Express (PCIe) standard.

4. The power-loss protection apparatus of claim 1, wherein the power-loss detection circuit is to alert the M.2 electronic card by outputting a signal to an input of the M.2 electronic card, the input when activated indicating that a power supply voltage is at an operational level.

5. The power-loss protection apparatus of claim 1, further comprising a support substrate on which the power source and the power-loss detection circuit are mounted.

6. The power-loss protection apparatus of claim 1, further comprising circuitry to couple the power source to the M.2 electronic card in response to the power loss, wherein the circuitry is without a switching matrix.

7. The power-loss protection apparatus of claim 1, wherein the power source includes a capacitor.

8. The power-loss protection apparatus of claim 1, wherein the power source includes a battery.

9. A power-loss protection apparatus comprising:
a temporary power source; and
a power-loss detection circuit to detect an indication of power loss in a client device, and to output, in response to the indication, a signal to an input of an electronic card for indicating to the electronic card that the power loss is about to occur,
the power-loss protection apparatus being separate from the electronic card that includes a volatile storage and a non-volatile storage, and wherein the signal is to trigger a transfer of data from the volatile storage to the non-volatile storage, and
wherein the input of the electronic card is a link interface reset input to the electronic card or an input to place the electronic card into a lower power state.

10. The power-loss protection apparatus of claim 9, wherein the input of the electronic card is a Peripheral Component interconnect Express (PCIe) reset input of the electronic card.

11. The power-loss protection apparatus of claim 9, wherein the input of the electronic card is a Serial Advanced Technology Attachment (SATA) input for placing the electronic card into the lower power state.

12. The power-loss protection apparatus of claim 9, wherein the indication of power loss in the client device includes deactivation of a power-good signal.

13. A method of power-loss protection, comprising:
detecting, by a power-loss detection circuit, power loss in a client device;
in response to the detecting of the power loss, outputting, by the power-loss detection circuit, a signal to a control input of an electronic card for indicating to the electronic card that the power loss is about to occur, the power-loss protection circuit being separate from the electronic card that includes a volatile storage and a non-volatile storage, wherein the control input of the electronic card is a link interface reset input to the electronic card or an input to place the electronic card into a lower power state; and
triggering a transfer of data from the volatile storage to the non-volatile storage in response to the signal, using power of a power source.

14. The method of claim 13, wherein the electronic card is an M.2 electronic card.

15. The power-loss protection apparatus of claim 1, wherein the power-loss detection circuit alerts the M.2 electronic card that power loss is about to occur upon detecting a power voltage in the client device dropping below a threshold voltage.

16. The power-loss protection apparatus of claim 1, further comprising a connection circuit to connect the power source to the M.2 electronic card in response to the power loss, the connection circuit comprising a diode between the power source and the M.2 electronic card.

17. The power-loss protection apparatus of claim 1, wherein the power-loss detection circuit comprises an AND gate to receive link interface reset signal and a power-good signal from the client device.

18. The power-loss protection apparatus of claim 1, wherein the power-loss detection circuit comprises a comparator to receive sense voltage signal from the client device and a reference voltage signal.

19. The power-loss protection apparatus of claim 1, further comprising a voltage regulator between the power source and the M.2 electronic card.

20. A power-loss protection apparatus comprising:
a power source; and
a power-loss detection circuit to detect an indication of power loss in a client device, and to alert an M.2 electronic card for indicating the power loss is about to occur,
the power-loss protection apparatus being separate from the M.2 electronic card that includes a volatile storage and a non-volatile storage, and wherein the alert is to trigger a transfer of data from the volatile storage to the non-volatile storage using power from the power source; and
wherein the power-loss detection circuit is to alert the M.2 electronic card by outputting a signal to a control input of the M.2 electronic card.

* * * * *

UNITED STATES PATENT AND TRADEMARK OFFICE
CERTIFICATE OF CORRECTION

PATENT NO. : 10,198,320 B2  
APPLICATION NO. : 15/520248  
DATED : February 5, 2019  
INVENTOR(S) : Byron A. Alcorn et al.

Page 1 of 1

It is certified that error appears in the above-identified patent and that said Letters Patent is hereby corrected as shown below:

In the Specification

In Column 1, below Title, Line 1, insert -- CROSS-REFERENCE TO RELATED APPLICATION This application is a U.S. National Stage Application of and claims priority to International Patent Application No. PCT/US2014/063323, filed on Oct. 31, 2014, and entitled "POWER-LOSS PROTECTION." --.

In the Claims

In Column 8, Line 41, Claim 10, delete "interconnect" and insert -- Interconnect --, therefor.

Signed and Sealed this  
Thirtieth Day of July, 2019

Andrei Iancu  
*Director of the United States Patent and Trademark Office*